United States Patent
Smith et al.

(10) Patent No.: US 7,233,543 B2
(45) Date of Patent: Jun. 19, 2007

(54) SYSTEM AND METHOD TO CHANGE DATA WINDOW

(75) Inventors: Victoria Lo-Ren Smith, Kumbo (CM); Theodore Carter Briggs, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 156 days.

(21) Appl. No.: 11/069,489

(22) Filed: Mar. 1, 2005

(65) Prior Publication Data

US 2006/0198233 A1 Sep. 7, 2006

(51) Int. Cl.
*G11C 8/00* (2006.01)

(52) U.S. Cl. ................... 365/233; 365/189.05; 365/193

(58) Field of Classification Search ........... 365/189.05, 365/193, 233
See application file for complete search history.

(56) References Cited

U.S. PATENT DOCUMENTS

| | | | |
|---|---|---|---|
| 6,279,073 B1 | 8/2001 | McCracken et al. | |
| 6,381,194 B2 | 4/2002 | Li | |
| 6,570,791 B2 | 5/2003 | Roohparvar et al. | |
| 6,728,162 B2 * | 4/2004 | Lee et al. | 365/233 |
| 6,760,261 B2 * | 7/2004 | Partsch et al. | 365/189.05 |
| 6,909,643 B2 * | 6/2005 | Kwean | 365/193 |
| 6,950,350 B1 * | 9/2005 | Kerl | 365/193 |
| 2004/0170200 A1 | 9/2004 | Radjassamy | |
| 2004/0170240 A1 | 9/2004 | Radjassamy | |
| 2004/0174765 A1 | 9/2004 | Seo et al. | |

OTHER PUBLICATIONS

Application Note No. XAPP384, "Interfacing to DDR SDRAM with CoolRunner-II CPLDs", Xilinx, Inc., Feb.14, 2003, vol. 10, pp. 1-20.
Wasim Alim, et al., "DDR FCRAM Boosts Performance in DDR SDRAM Designs", http://www.elecdesign.com/Articles/Print.cfm?ArticleID=2678, 2004, pp. 1-6.

* cited by examiner

*Primary Examiner*—Richard T. Elms
*Assistant Examiner*—N Nguyen

(57) ABSTRACT

A system to change a data window may include a plurality of registers. Each of the plurality of registers is operative, when activated, to receive data from a bi-directional data bus at a respective input. Each of the plurality of registers is activated in a predetermined sequence to latch a respective portion of the data from the bi-directional data bus so that each respective portion of the data has a longer data window at an output of each of the plurality of registers than at the respective input of each of the plurality of registers.

28 Claims, 6 Drawing Sheets

SYSTEM AND METHOD TO CHANGE DATA WINDOW

BACKGROUND

As computer and communication technology becomes more advanced, there is an increasing demand for faster digital communication within computers and communications devices. Use of a common clock, or system core clock, for the transmission and reception of data on different devices or circuits, such as communication between a processor and a memory device, may result in inefficient or inaccurate transfer of data at high speeds. A separate clock signal, or strobe signal, can be used to transmit data between devices. However, there tends to be uncertainty associated with timing of the data and the strobe signal relative to the system core clock.

DETAILED DESCRIPTION

Figure 1:
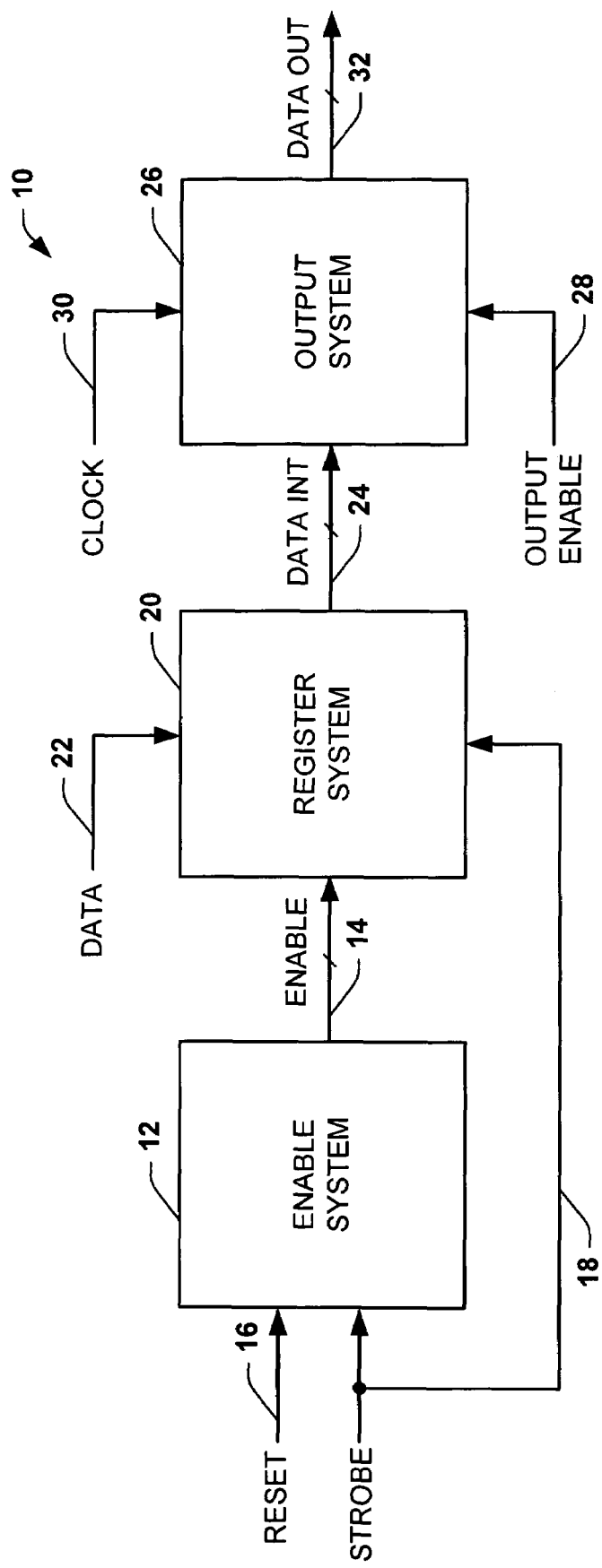
FIG. 1 depicts an embodiment of a system for changing a data window to facilitate data acquisition.

FIG. 1 depicts an example of a system 10 that can be employed to change a data window for DATA received from a data bus 22. The system 10 includes an enable system 12 that generates one or more enable signals 14 based on a reset signal 16 and a strobe signal 18. The reset signal 16 can be provided, for example, by associated circuitry such as a memory device, to initialize a read sequence for the system 10 to receive data from the data bus 22. The strobe signal 18 corresponds to a separate clock signal to which DATA from the data bus 22 is timed. The data bus 22 from which DATA is received may be a bi-directional or a unidirectional bus. For example, the bus may be a double-data rate (DDR) bus, which can be employed for interconnecting one or more associated devices (e.g., processors, memory modules, or other circuits) to the system 10.

The enable system 12 provides one or more enable signals 14 to a register system 20. The register system 20 employs the enable signals 14 to load DATA from the data bus 22 in a predetermined sequence. The register system 20 propagates the data based on the one or more enable signals 14 and the strobe signal 18. For systems with more than one enable signal, a plurality of enable signals 14 may have a phase-shifted or inverted relationship relative to one another to define the sequence at which DATA is loaded into the register system 20. A set of input registers in the register system 20 can thus load the DATA from the data bus 22 in the predetermined sequence according to the strobe signal 18.

The input registers of register system 20 may be any kind of digital device or circuit capable of transferring data from an input to an output upon some triggering condition. Examples may include a flip-flop, latch, or any other state-dependent or digital switching device known in the art. Register system 20 thus receives the DATA from the data bus 22, such as by latching the received DATA into input registers in a predetermined sequence based on enable signals 14 and the strobe signal 18.

The timing relationship of the enable signals 14 and the strobe signal 18 relative to each other causes input registers in the register system 20 to activate in the predetermined sequence. The activation of the register system 20 by the strobe signal 18 may occur at every rising edge of the strobe signal, every falling edge of the strobe signal, or, in the case of a DDR bus, registers in the register system can be activated at both every rising edge and every falling edge of the strobe signal 18. As a result of the activation of the input registers and enabling of such registers in the predetermined sequence, the register system 20 maintains the state of the DATA latched from the bus 22 for an extended duration and provides corresponding intermediate data (DATA INT) at 24. The intermediate data DATA INT thus has a duration, or data window, that is substantially longer than the duration as provided on the data bus 22 prior to entering the register system 20. For example, each word of the DATA on data bus 22 may have a duration that is a fractional part (e.g., about one-half) of a strobe cycle, whereas the representation of the same data at 24 can have a duration that is greater than one strobe cycle (e.g., about two strobe cycles). Sequential portions of the widened data DATA INT can also overlap based on activation of the register system 20 by the strobe signal 18 and the enable signal 18. The register system 20 thus widens or stretches each bit in the DATA stream and provides the widened data as DATA INT 24 to facilitate subsequent use of such data.

The register system 20 can provide the DATA INT 24 to an output system 26. The output system 26 can include a set of output registers, which may be identical in type and in quantity to the type and quantity of input registers contained in register system 20. Output system 26 receives an output enable signal 28 and a clock signal 30. The output system 26 latches the plurality of lines of the data DATA INT 24 from the register system 20 in a predetermined sequence based on the output enable signal 28 and the clock signal 30. It is the arrangement and timing of the output enable signal 28 and the clock signal 30 relative to each other that cause the output registers in the output system 20 to activate in the predetermined sequence. The clock signal 30 may be a system core clock generated, for example, by a frequency generator circuit. The output system 26, in turn, provides output data (DATA OUT) 32 at the frequency of the clock signal 30. For example, the DATA OUT signal 32 can be a multiple bit data stream synchronized relative to the clock signal 30, such as two or more parallel data lines corresponding to overlapping respective portions of the data provided by the register system 20. The conversion of the data into a multiple bit output stream 32 may be accomplished using multiplexers or any other multi-state switching devices.

Figure 2:
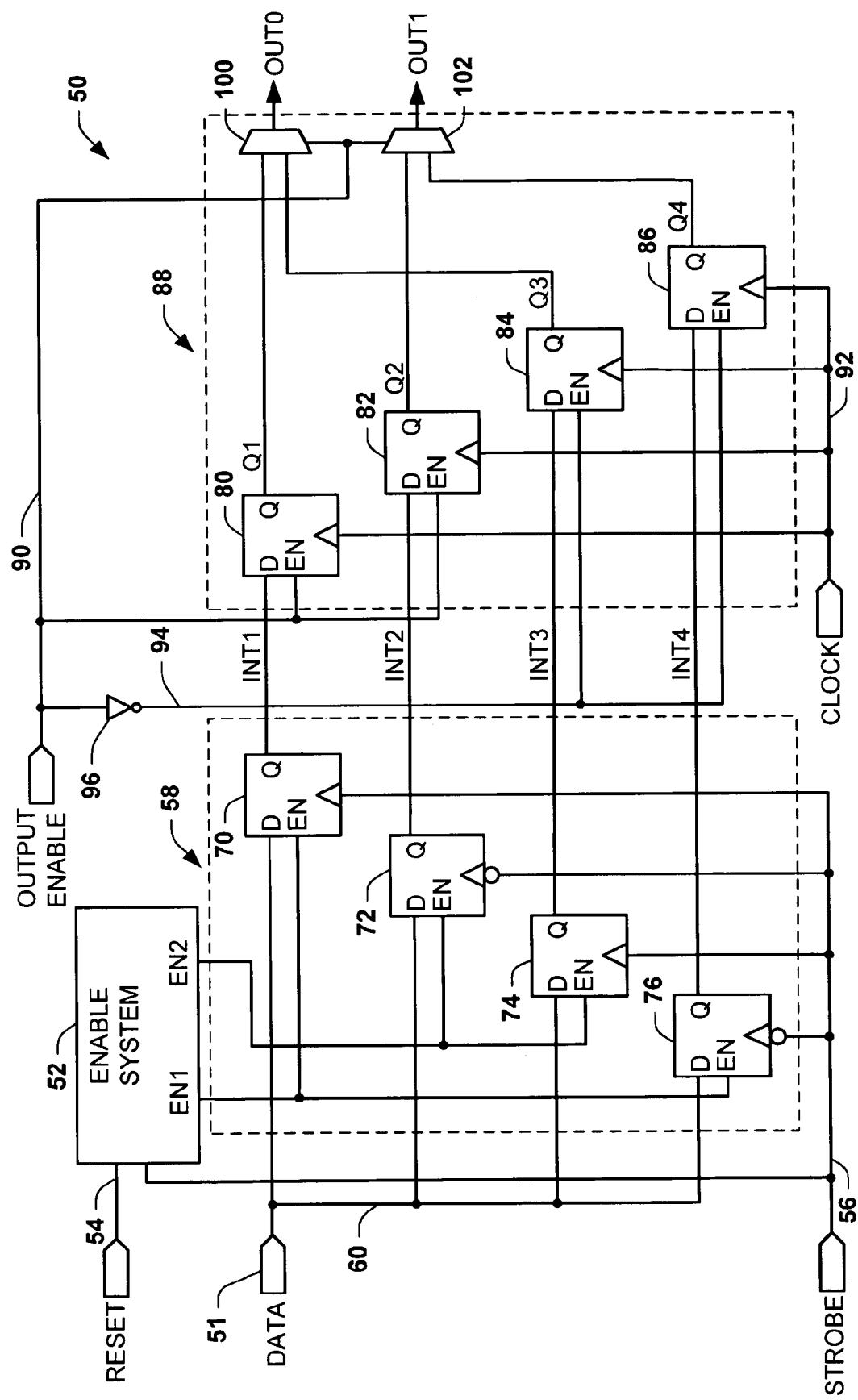
FIG. 2 depicts another embodiment of a system for changing a data window to facilitate data acquisition.

FIG. 2 illustrates another example of a system 50 that operates to extend a data window for data received from a data bus 51. In the example of the system 50, it is assumed that the data is received from a bi-directional DDR bus, but it should be known and appreciated that the system 50 could be suited to receive data from other types of data bus structures.

The system 50 of FIG. 2 includes an enable system 52 which receives a reset signal 54 and a strobe signal 56 as inputs. The strobe signal 56 may also be part of the bi-directional DDR bus 51. The reset signal 54 can be generated from a device separate from the system 50, such as a memory device. In the example of FIG. 2, the enable system 52 generates a pair of enable signals, EN1 and EN2, based on the reset signal 54 and the strobe signal 56. The enable system 52 provides the enable signals EN1 and EN2 as inputs to a register system 58. The register system 58 also receives a data signal 60 and the strobe signal 56. The data signal 60 transmits data via the bi-directional DDR bus 51 to the register system 58. The data can be single bit or multi-bit data. The strobe signal 56 is a periodic clock signal timed to the data signal 60, which is also received from the bi-directional DDR bus 51.

The register system 58 includes a set of input registers 70, 72, 74, and 76. The respective input registers 70, 72, 74, and 76 in the register system 58 are enabled based on the enable signals EN1 and EN2. Specifically, as depicted in system 50, enable signal EN1 enables input registers 70 and 76, while enable signal EN2 enables input registers 72 and 74. The input registers 70, 72, 74, and 76 are depicted as D flip-flops, but it should be understood and appreciated by those skilled in the art that other types of devices can be utilized for acquiring the data from the bus 51. In the example of FIG. 2, and as demonstrated with reference to FIG. 3, the pair of enable signals EN1 and EN2 of the system 50 can be inverted relative to each other. However, other combinations of signals which can be employed for enabling the input devices in the register system 58 will be understood and appreciated by those skilled in the art, of which the signals may vary according to the types of devices utilized to latch the data 60 from the bus 51.

The register system 58 receives the strobe signal 56, the data signal 60, and enable signals EN1 and EN2. Strobe signal 56 triggers the activation of input registers 70, 72, 74, and 76 to latch the DATA from the data bus 51 based on the respective enable signal, either EN1 or EN2. In the example of FIG. 2, each of the input registers 70 and 76 are enabled when the respective enable signal EN1 is high (i.e. logic 1). Similarly, input registers 72 and 74 are enabled when the respective enable signal EN2 is high. The input registers (or other switching devices) 70, 72, 74, and 76 could be enabled by signals having different logic levels from that shown and described herein.

In the example of system 50, the input registers 72 and 76 include inverted clock inputs for receiving the strobe signal 56. The DATA signal 60 can be received from a bi-directional DDR bus, such that the DATA signal is timed in synchronization with the strobe signal 56. For example, the DATA signal 60 can be timed so that every rising edge and every falling edge of the strobe signal 56 is aligned with a corresponding data bit in the DATA signal. To facilitate latching data into the input registers 70, 72, 74, and 76 in a predetermined sequence, input registers 70 and 74 are activated to latch data bits timed to the rising edge of strobe signal 56, and input registers 72 and 76 are activated to latch data bits timed to the falling edge of strobe signal 56.

Figure 3:
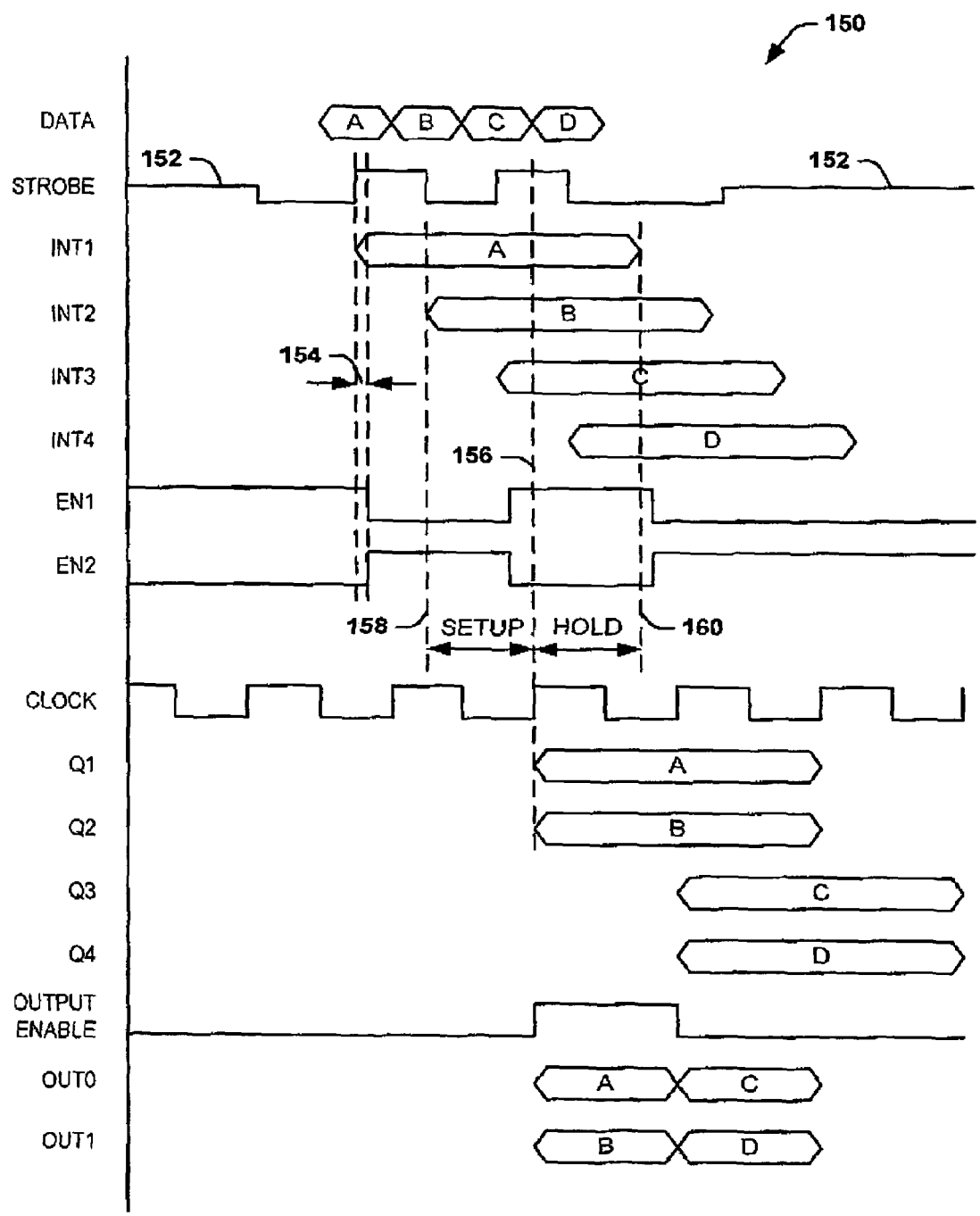
FIG. 3 depicts a timing diagram demonstrating relative timing of signals that may propagate in an embodiment of a system.

FIG. 3 demonstrates a timing diagram 150 for the system 50 illustrated in FIG. 2. For purposes of describing the timing diagram 150, like reference numbers will be used to describe the signals as they correspond to the various signals of the system 50 described in FIG. 2. The DATA signal 60 is depicted in the timing diagram 150 as a series of four data bits, A, B, C, and D. The data bits A, B, C, and D correspond to four sequential bits that could be received as DATA from the bus 51 (e.g., a bi-directional DDR bus). As such, the data bits A, B, C, and D are depicted in the timing diagram 150 as being timed to both rising and falling edges of the strobe signal 56 to account for the double data-rate of the bus. Additionally, because the DDR bus is bi-directional in the example of the system 50 of FIG. 2, the strobe signal 56 can be active during a read sequence with read data, as described herein, and the strobe signal can be active during a write sequence with write data on the bus 51. Accordingly, during a write sequence, the register 204 may toggle an unknown number of times between read sequences, but data will not be latched due to the absence of the reset signal at 54. The strobe signal 56 can be in tri-state condition 152 between read and write sequences.

The timing diagram 150 demonstrates the relationship between the strobe signal 56 and the enable signals EN1 and EN2 to latch the input registers 70, 72, 74, and 76 of FIG. 2 in a predetermined sequence. In the example of the system 50, the predetermined sequence of data latching is that the input registers 70, 72, 74, and 76 latch each bit of the DATA sequentially into respective registers. Each of the input registers 70, 72, 74, and 76 latches the DATA from the bus 51 according to the data at the input while the latch is enabled by the respective enable signal and its clock input is asserted by the strobe signal 56 to activate the respective register. The input register 70 latches the bit A from the DATA signal 60 at a rising edge of strobe signal 56 while the enable signal EN1 is high at the enable input. The input register 70 thus outputs an intermediate signal INT1 corresponding to the bit A latched from data signal 60. Next, the input register 72 latches the bit B from the DATA signal 60 upon a falling edge of the strobe signal 56 while the enable signal EN2 is high at the enable input. The input register 72 thus outputs an intermediate signal INT2 corresponding to the bit B latched from the data signal 60. Next, the input register 74 latches the bit C from the DATA signal 60 upon a rising edge of the strobe signal 56 while the enable signal EN2 is high at the enable input. The input register 74 thus outputs an intermediate signal INT3 corresponding to the bit C latched from the DATA signal 60. Finally, the input register 76 latches the bit D from the DATA signal 60 upon a falling edge of the strobe signal 56 while the enable signal EN1 is high at the enable input. The input register 76 thus outputs an intermediate signal INT4 corresponding to the bit D latched from the, DATA signal 60. In this way, each of the input registers 70, 72, 74, and 76 latches a separate data bit sequentially at every half duty-cycle of the strobe signal 56, such that each output INT1, INT2, INT3, and INT4 is delayed by a half of a period of the strobe cycle 56 from the output that preceded it in the sequence.

Figure 4:
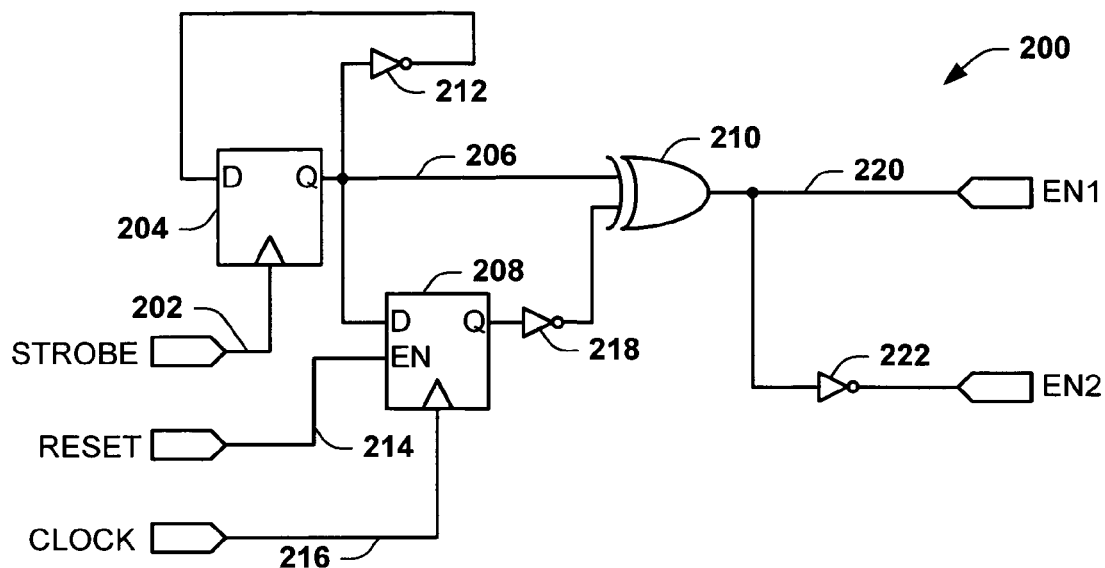
FIG. 4 depicts an embodiment of an enable system.

The enable signals EN1 and EN2 are illustrated in the timing diagram 150 to be in the appropriate states to latch data bits A, B, C, and D into input registers 70, 72, 74, and 76. It is the time duration of the states of the enable signals EN1 and EN2 relative to when the input registers 70, 72, 74, and 76 are activated that operates to extend the data window of the data bits A, B, C, and D of the intermediate signals INT1, INT2, INT3, and INT4 relative to the data bits A, B, C, and D on the DATA signal 60 timed to the strobe signal 56 on the data bus 51. For example, as described above, the input register 70 latches the data bit A when the enable signal EN1 is high and the register is activated by a rising edge of the strobe signal 56. However, the input register 70 does not load another data bit at the next rising edge of the strobe signal 56 because the enable signal 70 is low (i.e. logic 0). Accordingly, the data bit A remains latched in the input register 70 for two cycles of the strobe signal 56, thus extending the data window of the bit A by about four times the duration that it appears in the DATA signal 60 on the bi-directional DDR bus 51. The other input registers 72, 74, and 76 operate in a similar manner with different combinations of states of the enable signals EN1 and EN2 and the strobe signal 56;

It should be understand that, as will be further demonstrated with regard to FIG. 4, the enable signals EN1 and EN2, as depicted in the example of the system 50 and the corresponding timing diagram 150, change state at a rising edge of the strobe signal 56. Because the input registers 70 and 74 in the example of system 50 are also latched on a rising edge of the strobe signal 56, a delay time gap 154 has been illustrated in the timing diagram 150 to demonstrate that there is a slight time delay from the point at which the input registers 70 and 74 latch the data bits A and C, respectively, and when the enable signals EN1 and EN2 change state from the same event. It should be noted that the timing diagram 150 of FIG. 3 is an otherwise ideal timing diagram and thus contains no other propagation or switching delays, though inherent propagation and switching delays may be present.

Referring back to FIG. 2, the register system 58 thus provides the intermediate data signals INT1, INT2, INT3, and INT4 as inputs to a set of output registers 80, 82, 84, and 86 in an output system 88. Output system 88 also receives as inputs an OUTPUT ENABLE signal 90 and a clock signal 92. For example, the clock signal 92 may be the system core clock, such as can be generated by a frequency generator. The OUTPUT ENABLE signal may be provided by a device separate from the system 50, such as by a memory device. An inverter 96 inverts the output enable signal 90 to provide an inverted OUTPUT ENABLE signal 94 to the output system 88. The intermediate data signals INT1, INT2, INT3, and INT4, which have a wider data window than the respective data bits in the DATA signal 60, are latched into the output registers 80, 82, 84, and 86 in a predetermined sequence based on the relationship of the OUTPUT ENABLE signal 90 (or corresponding inverted OUTPUT ENABLE signal 94) and the clock signal 92. In the example of system 50, pairs of the output registers activate to latch data simultaneously.

For example, turning once again to FIG. 3, when the OUTPUT ENABLE signal 90 is high, a rising edge of the clock signal 92 will simultaneously latch the data bit A on the intermediate signal INT1 into the output register 80 and the data bit B on the intermediate signal INT2 into the output register 82, respectively. Output registers 80 and 82 will thus simultaneously output signals Q1 and Q2, respectively. Accordingly, when the output enable signal 90 is low, and thus the inverted output enable signal 94 is high, a rising edge of the clock signal 92 will simultaneously latch the data bit C on the intermediate signal INT3 into the output register 84 and the data bit D on the intermediate signal INT4 into the output register 86, respectively. Output registers 84 and 86 will thus simultaneously output signals Q3 and Q4, respectively.

Because the output registers 80, 82, 84, and 86 in the output system 88 are triggered using the clock signal 92, and not the strobe signal 56, as are the input registers 70, 72, 74, and 76 in the register system 58, there is an inherent amount of uncertainty of timing in the system 50. The timing uncertainty is based on the timing of the DATA signal 60, which is timed to the strobe signal 56, relative to the timing of the clock signal 92. This timing uncertainty is demonstrated in the timing diagram 150 of FIG. 3 by a dashed line 156, which is aligned at a rising edge of the clock signal 92, but is not aligned with a known point on the strobe signal 56. The uncertainty between the relative timing of the strobe signal 56 and the clock signal 92 makes it difficult to synchronize the data timed to the strobe signal 56 to the clock signal 92, such that, for example, errors resulting from metastability may occur in the transfer of data between two devices communicating at high speed, such as a processor and a memory device. This timing uncertainty is tolerated by the system 50 because of the extension of the data window of the data in the intermediate data signals INT1, INT2, INT3, and INT4 resulting from the predetermined sequence in which the input registers 70, 72, 74, and 76 of the register system 58 are latched.

The advantages of the extension of the data window associated with the intermediate data signals INT1, INT2, INT3, and INT4 is apparent with regard to the latching of the output registers 80, 82, 84, and 86. In the example of the system 50 and the timing diagram 150, pairs of output registers, 80 and 82 as one pair and 84 and 86 as the other pair, respectively, activate to latch data concurrently using the output enable signal 90, or inverted output enable signal 94, and the clock signal 92. Due to the extended data window of the data bits A, B, C, and D in the intermediate data signals INT1, INT2, INT3, and INT4, there is a substantial time overlap of latched data between sequential intermediate data signals INT1, INT2, INT3, and INT4. Because of the overlap, at the rising edge of clock signal 92 at the dashed line 156, output registers 80 and 82 simultaneously latch the data bits A and B, respectively, into the output signals Q1 and Q2. To ensure that the data bits A and B are latched simultaneously, the rising edge of the clock signal 92 that triggers the activation of the output registers 80 and 82 occurs within the window of time that the data bits A and B overlap in the intermediate data signals INT1 and INT2, respectively. This window of time is depicted in timing diagram 150 as the time between dashed lines 158 and 160, which represents an extended window in which activation of the output registers 80 and 82 can occur to provide the multi-bit output data Q1 and Q2 synchronized with the clock signal 92 with a high degree of certainty. That is, the extended time window in which data bits A and B overlap mitigates uncertainty of data capture that otherwise may exist due to the occurrence of a metastable condition between the input data and the output data. More specifically, as long as the time between dashed lines 158 and 160 is greater than or equal to a setup-and-hold time of the output registers 80 and 82, metastability of the data latched in the output registers 80 and 82 may be prevented, regardless of the relative timing between the strobe signal 56 and the clock signal 92.

Thus, as demonstrated by the example of the system 50 and the timing diagram 150, the approach described herein can extend the data window of data latched at the outputs of the registers 70, 72, 74 and 76 as well as provide overlap between sequential data at the outputs of the registers 70, 72, 74 and 76. The amount of overlap between sequential data latched at the outputs of the registers 70, 72, 74 and 76 provides an extended window to facilitate latching and of data by the output registers 80, 82, 84 and 86 synchronized relative to the system clock. As a result, the setup-and-hold time of the output registers 80 and 82 as well as for registers 84 and 86 resides within the extended window corresponding to the amount of overlap between sequential data at the output of the registers 70, 72, 74 and 76. The extended window thus enables latching data with reduced uncertainty relative to many conventional approaches. It should further be appreciated that, as depicted in the timing diagram 150 of FIG. 3, the same operation occurs to create an extended data window between the intermediate data signals INT3 and INT4 for the latching of the data bits C and D into the output registers 84 and 86 with reduced uncertainty.

Referring back to FIG. 2, the outputs of the output registers 80, 82, 84, and 86 are coupled to provide the output signals Q1, Q2, Q3, and Q4 to an output system, which could include, as demonstrated in FIG. 2, output switches 100 and 102 of the system 50. The output switches 100 and 102 can provide the output signals Q1, Q2, Q3, and Q4 as a multiple bit output stream, indicated in FIG. 2 as output signals OUT0 and OUT1. As an example, the output switches 100 and 102 may be implemented as multiplexers or any other kind of multi-state switching device known in the art. In the example of FIG. 2, the OUTPUT ENABLE signal 90 controls the output switches 100 and 102 to provide the output signals OUT0 and OUT1. That is, the OUTPUT ENABLE signal 90 toggles output switch 100 between the signals Q1 and Q3 to provide the output signal OUT0, and the OUTPUT ENABLE signal 90 toggles the output switch 102 between the signals Q2 and Q4 to generate the output signal OUT1. While the output states of the switches 100 and 102 are demonstrated in the example of the system 50 as being controlled by the OUTPUT ENABLE signal 90, it should be appreciated by one skilled in the art that the output switches 100 and 102 can be controlled by a number of other means to generate the desired resultant output signals OUT0 and OUT1, such as, for example, by using the clock signal 92.

The timing diagram 150 of FIG. 3 also demonstrates the relationship between the output signals OUT0 and OUT1 from the output switches 100 and 102, respectively, and the output enable signal 90 which toggles the output switches between states. As depicted in timing diagram 150, the output switches 100 and 102 change states at every change of state of the output enable signal 90, thus resulting in a separate pair of output data bits switched from the outputs of the output registers 80, 82, 84, and 86.

It should be understood and appreciated that there are a number of ways to achieve the results of the system 50 to extend the data window for data received from a data bus, and that the results achieved are thus not limited to the example of the system 50. For example, another system could achieve similar or same results utilizing more or less input registers, output registers, and output switches. Different combinations of input signals, or alternatively time shifted signals, could also achieve similar or the same results as that depicted in the system 50 and the corresponding timing diagram 150.

FIG. 4 depicts an example of an enable system 200 that may be used to generate one or more enable signals for enabling operation of a register system, such as described herein. For example, the enable system 200 can be employed to generate the enable signals EN1 and EN2 in the system 50 of FIG. 2. The enable system 200 includes a D flip-flop 204 that receives a STROBE signal 202 at a clock input for activating the flip-flop. The flip-flop 204 has an output 206 that drives an input of another D flip-flop 208 and an XOR gate 210. Additionally, the output 206 of the flip-flop 204 is fed back to an input of the flip flop 204 through an inverter 212. The circuit arrangement associated with the flip-flop 204 results in a change of state at the output 206 at every rising edge of strobe signal 202.

The flip-flop 208 receives a RESET signal 214 as an enable input and receives a CLOCK signal 216 at a clock input that is used to trigger activation of the flip-flop. The CLOCK signal 216 may be a system core clock generated, for example, by a frequency generator, a timer, oscillator circuit, or other circuitry (internal or external) that may provide a system clock. The D flip-flop 208 drives an inverter 218, which provides an inverted version of the input from the flip-flop as a second input to the XOR gate 210. The XOR gate 210 provides an enable signal EN1 at an output 220 of the XOR gate. An inverter 222 inverts the signal at 220 to provide another enable signal EN2, which is out of phase relative to EN1.

By way of example, when a read sequence begins, the RESET signal 214 changes state to a low condition, which disables the flip-flop 208. This causes the flip-flop 208 to maintain its present state corresponding to the signal at 206 just prior to the RESET signal 214 going low (regardless of the state of the clock signal 216). The flip-flop 204 is activated based on the STROBE signal 202, which, prior to a read sequence, may be in a tri-state or a constant state condition. Accordingly, the flip-flop 204 maintains its output 206 at a constant state prior to a read sequence, causing the output of inverter 218 to maintain a constant state inverted from output 206 prior to a read sequence. The result is that the output 220 of the XOR gate 210 in the example of circuit 200 prior to a read sequence is a logic 1. Therefore, in the example of circuit 200, prior to a read sequence, EN1 is a logic 1 and EN2 is a logic 0 (see, e.g., FIG. 3).

After the RESET signal 214 has changed to a low condition, the STROBE signal 202 begins to cycle. At every rising edge of the strobe signal 202, the D flip-flop 204 is triggered, causing the output 206 to change state. Because the output 206 is alternating states at every rising edge of the strobe signal 202 during a read sequence, and because the output of inverter 218 remains constant, the output 220 from the XOR gate 210 alternates states with every rising edge of the strobe signal 202 during the read sequence. Thus, the enable signals EN1 and EN2 change state (inverted relative each other) at every rising edge of strobe signal 202 during a read sequence, such that each enable signal EN1 and EN2 has a period that is greater than (e.g., twice) the period of the strobe signal.

It should be understood and appreciated that there are a number of ways to generate the enable signals required to latch data into the set of input registers in the predetermined sequence, and that the results achieved are thus not limited to the example of the system 200. For example, more or less enable signals could be generated with different phase shifts relative to each other. Enable signals could change states at all times, and not just during a read sequence. The system 200 is merely an example circuit to generate enable signals such as could be used by the example of the system 50.

Figure 5:
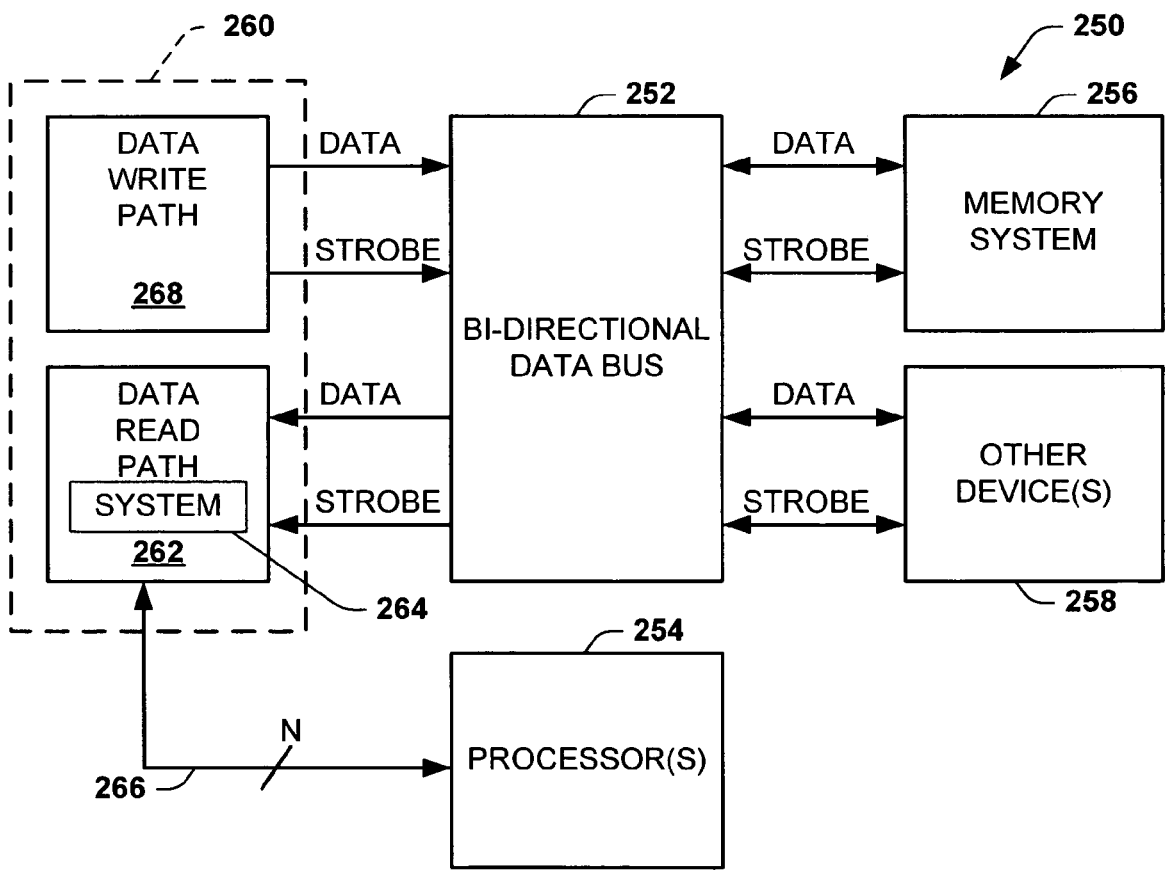
FIG. 5 depicts an example of a system employing an embodiment of a system for changing a data window.

FIG. 5 depicts an example of a system 250 for changing the data window to facilitate acquisition of data from a bus 252. In the example of FIG. 5, the bus 252 is a bi-directional data bus. The bi-directional data bus 252 can be configured to communicate data to and from a number of devices, such as a memory system 256, which could be, for example, a dynamic random access memory (DRAM). The bi-directional data bus 252 could also be configured to communicate data to and from one or more other devices 258. For example, one or more processors 254 can communicate with the memory system 256 or other additional devices 258, such as for reading data from or writing data to the memory system or other devices. The other devices may be, for example, peripheral devices, network or communication devices, or additional processing devices. The data transferred across the bus 252 can be accompanied by a strobe signal to facilitate its transfer through the bus.

The system 250 can further include a data path system 260 interconnected between the processor 254 and the bi-directional data bus 252. The data path system 260 includes a data read path 262 for reading data from the memory 256 or the other devices 258. The data read path 262 also includes a system 264 for changing the data window of the data being read to facilitate its acquisition from the bi-directional data bus 252. Particularly, the system 264 can receive data and strobe signals from the bi-directional data bus 252 and operate to widen the data window associated with such data. For instance, the system 264 can latch the data sequentially into a register system and output the data as a multi-bit data stream, indicated at 266, to the processor 254.

Additionally, the data path system 260 can also include a data write path 268 that is operative to write data received from the processor 254 to the memory system 256 and/or to the other device(s) 258. The data write path 268 writes data through the bi-directional data bus 252 as strobed data that includes a data signal and a strobe signal. While, for purposes of simplicity of illustration, the data and strobe signals are shown for each of the data read path 262 and the data write path 268, those skilled in the art will understand that typically the same lines can be employed for reading and writing data and for providing the strobe signals between the data paths and the bus 252.

Figure 6:
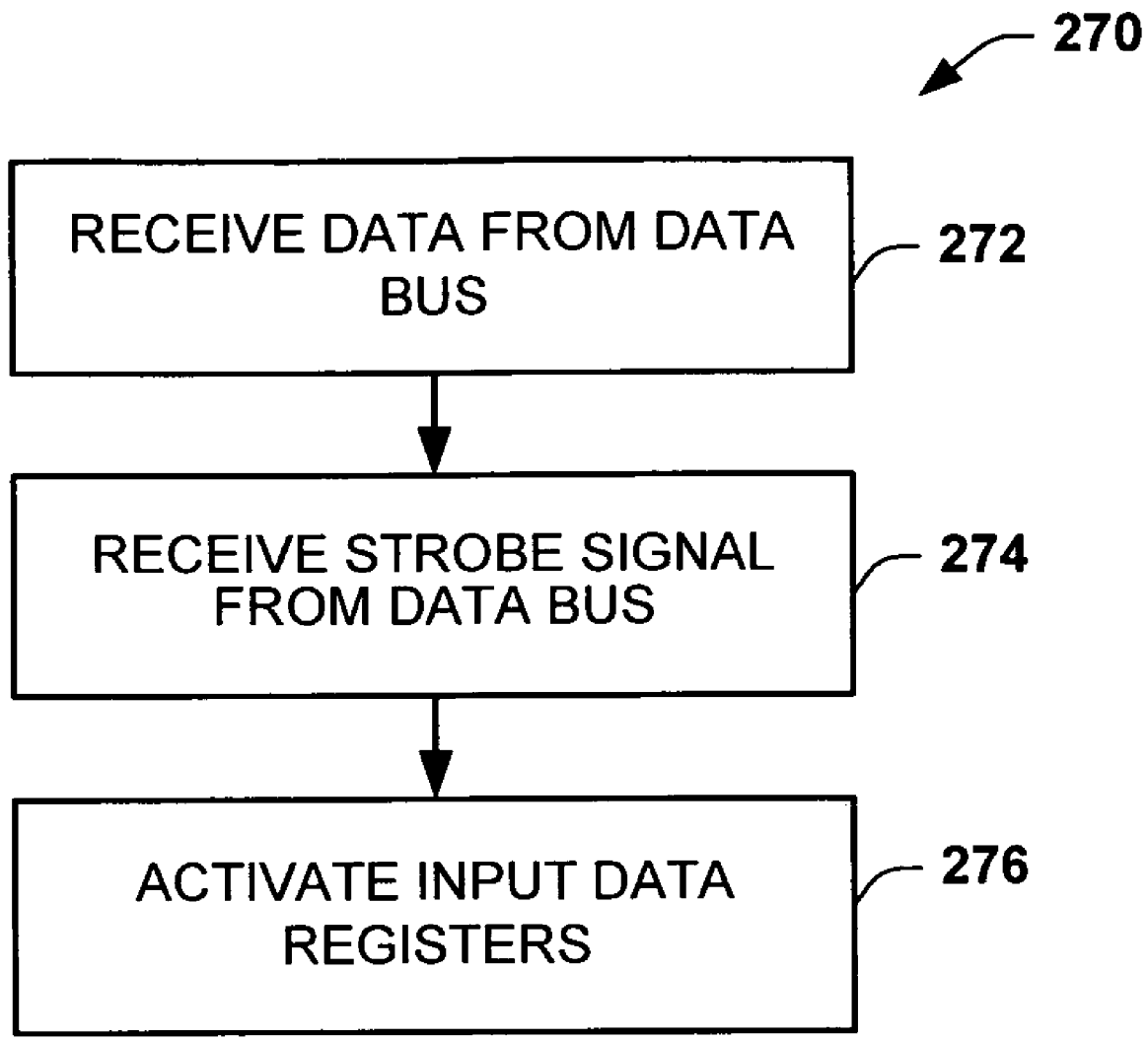
FIG. 6 is a flow diagram depicting an embodiment of a method for changing a data window.
Figure 7:
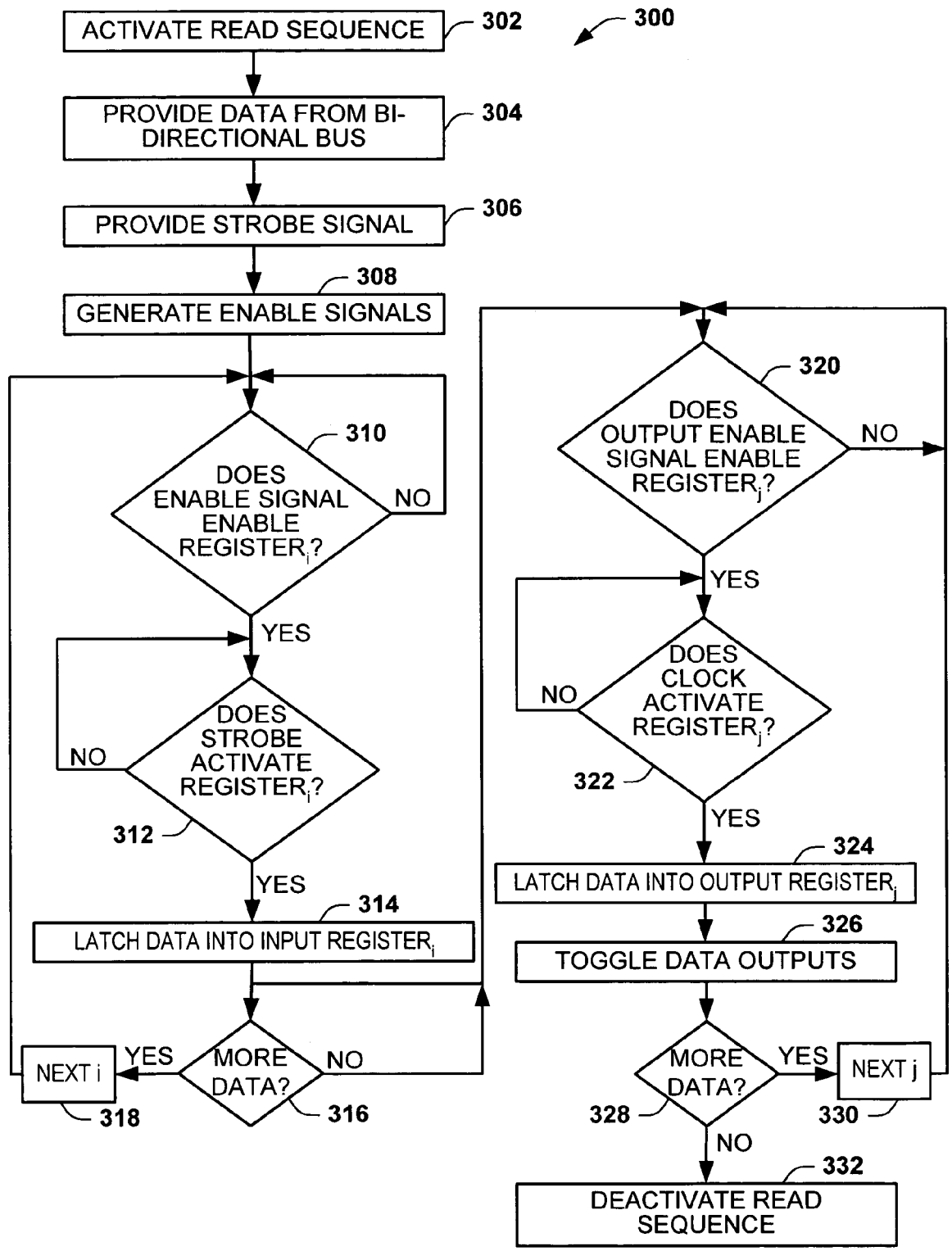
FIG. 7 is a flow diagram depicting an embodiment of another method for changing a data window.

In view of the foregoing structural and functional features described above, certain methods will be better appreciated with reference to FIGS. 6 and 7. It is to be understood and appreciated that the illustrated actions, in other embodiments, may occur in different orders and/or concurrently with other actions. Moreover, not all illustrated features may be required to implement a method. It is to be further understood that the following methodologies can be implemented in hardware (e.g., analog or digital circuitry, such as may be embodied in an application specific integrated circuit or a computer system), software (e.g., as executable instructions stored on a computer readable media or running on one or more computer systems), or any combination of hardware and software.

FIG. 6 depicts an example of a method 270. The method includes receiving data from a bi-directional data bus, as shown at 272. A strobe signal associated with the data received from the bi-directional data bus is also received at 274. At 276, respective portions of the data from the bi-directional data bus are latched in a predetermined sequence to provide latched data based on the strobe signal and at least one enable signal such that each respective portion of the latched data has a longer data window than a data window of for the data that is received from the data bus and the data windows of at least some respective portions of the latched data in the predetermined sequence overlap.

FIG. 7 depicts an example of another flow diagram for a method 300 that can be employed to change a data window. At 302, a read sequence is activated to enable data to be read from a data bus, such as a bi-directional DDR bus. The activation of the reset sequence may involve asserting a reset signal to initialize a read sequence. At 304, data is provided via the bi-directional data bus. At 306, a strobe signal associated with the data on the bus is also provided. The timing of the strobe signal relative to the data, for example, can be one piece of data (e.g., a bit or plural bits) per each rising edge of the strobe signal. In the case of a bi-directional DDR bus, one data bit can be provided with each rising edge and another data bit for each falling edge of the strobe signal.

At 308, one or more enable signals are generated. The enable signals are employed to enable a set of input registers. There could be any number of one or more enable signals, typically depending on the configuration of hardware and number of input registers being employed to latch data from the bus. For instance, a pair of enable signals that are out of phase relative to each other can be employed for enabling respective sets of registers for latching data in a predetermined sequence.

At 310, a determination is made as to whether an enable signal is present at a given input register$_i$ to enable the register. If the enable signal is present, the method proceeds to 312, at which point a determination is made as to whether the strobe signal activates register$_i$. For example, the strobe signal may activate register$_1$ when a rising edge of the strobe signal or a falling edge of the strobe signal is provided at a corresponding clock input of the registers. After register$_1$ is activated, the method 300 proceeds to 314 where data (e.g., a bit) is latched into register$_i$.

After the data has been latched into register$_i$, the method proceeds to 316 to determine if there is additional data to read from the bi-directional data bus. If there is additional data on the bi-directional data bus, the method 300 proceeds to 318 to increment to a next input register$_i$ and then looping back to 310. If there is no additional data on the bi-directional data bus, the method 300 proceeds to 320 regarding output register$_j$.

The method 300 also proceeds from 314 to 320 for implementing another part of the method 300, namely for propagating the data latched at 314 through an output register$_j$. At 320, the method is idle until an output enable signal enables a given output register$_j$. When the output enable signal enables the output register$_j$, the method proceeds to 324. At 324, the method maintains the state of the output register$_j$ until activated by a clock signal. The clock signal may activate the output register$_j$, for example, at a rising edge (or a falling edge) of the clock signal. Once register$_j$ is activated, the method proceeds to 324 to latch intermediate data into the output register$_j$. After the data bit has been latched into register$_j$, the method proceeds to 326 where data output switches can be toggled to provide a multi-bit output signal (e.g., on a two or more bit bus). The output switches may be multiplexers or any other kind of multi-state switching device known in the art. The toggling of the output switches may occur in response to the output enable signal, a rising edge of the system clock, or some other predefined event to achieve the desired output timing.

At 328, the method 300 then determines if additional data has been provided to the output register$_j$ from the input registers at 328. If there is additional data, the method 300 proceeds to 330 for incrementing to a next output register and looping back to 316 to propagate such additional data through the next output register$_j$. If, at 328, there is no additional data input to the output register$_j$ from the input register$_i$, the method 300 proceeds to 332 where the read sequence for acquiring data from the bi-directional data bus is deactivated. This could be accomplished by changing the state of a reset signal, for example. After the read sequence has been deactivated, the method 300 ends at 334.

It is to be understood and appreciated that the branching of the method from 314 to both 316 and 318 is to demonstrate that more than one unit of data can be propagated according to the method 300 through more than one register as part of the read sequence. It is to be further understood that data can also be propagated concurrently through more than one input register as well as concurrently through more than one output register.

What have been described above are examples of the present invention. It is, of course, not possible to describe every conceivable combination of components or methodologies for purposes of describing the present invention, but one of ordinary skill in the art will recognize that many further combinations and permutations of the present inven-

What is claimed is:

1. A system comprising:
a plurality of registers, each of the plurality of registers being operative, when activated, to receive data from a bi-directional data bus at a respective input;
each of the plurality of registers is activated in a predetermined sequence to latch a respective portion of the data from the bi-directional data bus so that each respective portion of the data has a longer data window at an output of each of the plurality of registers than at the respective input of each of the plurality of registers; and
an enable system operative to provide at least one enable signal to the plurality of registers based on a strobe signal.

2. The system of claim 1, wherein the bi-directional data bus comprises a bi-directional double-data rate bus.

3. An integrated circuit comprising the system of claim 1.

4. The system of claim 1, wherein the plurality of registers are latched sequentially such that there is a substantial amount of time overlap between the data windows of at least sonic of the respective portions of the data latched at the output of the plurality of registers.

5. The system of claim 4, wherein the plurality of registers is a plurality of first data registers, the system further comprising a plurality of second data registers operative to receive and latch data from respective outputs of the plurality of first data registers based on a system clock.

6. The system of claim 5, wherein the plurality of second data registers has a setup-and-hold time residing within the time overlap between the data windows of the at least some of the respective portions of the data latched at the output of the plurality of registers to facilitate latching the overlapping respective portions of the data into corresponding ones of the plurality of second data registers.

7. The system of claim 6, further comprising an output system operative to output synchronized data from the plurality of second data registers based on the system clock.

8. The system of claim 7, wherein the output system outputs the synchronized data as a multiple bit data stream based on an output enable signal and the system clock, the multi-bit data stream being provided as parallel data that includes the overlapping respective portions of the data.

9. The system of claim 1, wherein the enable system provides multiple enable signals, each of the multiple enable signals having a phase shift relative to each other and having a period greater than a period of the strobe signal to facilitate activation of the plurality of registers in the predetermined sequence.

10. The system of claim 9, wherein the multiple enable signals operate in conjunction with the strobe signal to maintain a state of the output of for each of the plurality of registers corresponding to the respective portion of the data for a duration that is greater than a duration in which the data appears at the respective input of the plurality of registers.

11. The system of claim 9, wherein a first enable signal of the multiple enable signals enables a first subset of the plurality of registers and a second enable signal of multiple enable signals enables a second subset of the plurality of registers such that the second subset of the plurality of registers is enabled out of phase relative to the first subset of the plurality of registers.

12. A system comprising:
an enable system operative to provide at least one enable signal;
a plurality of first data registers, each first data register being operative to latch data received from a data bus sequentially to respective outputs of the plurality of first data registers based on a strobe signal and the at least one enable signal, the at least one enable signal having a period that is greater than a period of the strobe signal such that the data at the respective outputs of the first data registers have respective data windows that are greater than data windows of the data received from the data bus; and
a plurality of second data registers operative to receive the latched data from the plurality of first data registers and operative to provide output data corresponding to the latched data synchronized relative to a system clock.

13. The system of claim 12, wherein the data bus comprises a bi-directional double-data rate bus.

14. An integrated circuit comprising the system of claim 12.

15. The system of claim 12, wherein the plurality of first data registers latch the data received from a data bus sequentially such that there is a substantial amount of time overlap between data windows of at least some sequential data that is latched at the output of the plurality of first data registers.

16. The system of claim 15, wherein the plurality of second data registers has a setup-and-hold time residing within the time overlap between the data windows of at least some sequential data latched at the plurality of first data registers to facilitate latching the overlapping respective portions of the data into at least some of the plurality of second data registers.

17. The system of claim 16, further comprising an output system operative to output synchronized sequential sets of data from the second plurality of data registers as a multiple bit data stream that corresponds to the overlapping respective portions of the data based on the system clock.

18. A system comprising:
means for generating at least one enable signal based on a strobe signal provided with strobed data from a bi-directional data bus; and
means for sequentially latching the strobed data received from the bi-directional data bus and for extending a data window of the strobed data to provide corresponding latched data based on the at least one enable signal and the strobe signal.

19. The system of claim 18, further comprising means for latching the corresponding latched data from the means for sequentially latching the strobed data based on the system clock, an extended data window of a portion of the corresponding latched data overlapping with an extended data window of at least some of a sequential portion of the corresponding latched data to define an overlapping window within which a setup-and-hold time for the means for latching the corresponding latched data resides to facilitate the latching of the corresponding latched data.

20. The system of claim 19, further comprising means for outputting data from the means for latching the corresponding latched data as a multiple bit stream that is synchronized relative to the system clock.

21. The system of claim 18, wherein the bi-directional data bus comprises a bi-directional double-data rate bus, and the system further comprises a dynamic random access memory (DRAM), the bi-directional data bus providing the data from the DRAM to respective inputs of a plurality of first data registers.

22. The system of claim 18, wherein the means for sequentially latching the strobed data are activated based on the strobe signal and the at least one enable signal to maintain a state of the corresponding latched data for a duration that is greater than a duration of the strobed data on the bi-directional bus and such that at least some sequential portions of the corresponding latched data overlap.

23. An integrated circuit comprising the system of claim 18.

24. A method comprising:
receiving data from a bi-directional data bus;
receiving a strobe signal associated with the data received from the bi-directional data bus;
latching respective portions of the data from the bi-directional data bus in a predetermined sequence to provide latched data based on the strobe signal and at least one enable signal such that each respective portion of the latched data has a longer data window than a data window of for the data that is received from the data bus and the data windows of at least some respective portions of the latched data in the predetermined sequence overlap; and
latching the latched data based on a system clock and at least one output enable signal to provide corresponding output data that is synchronized relative to the system clock.

25. The method of claim 24, wherein the latching of the respective portions of the data from the bi-directional data bus is performed by a plurality of first registers based on the strobe signal and the at least one enable signal, and the latching of the latched data is performed by a plurality of second registers from respective outputs of the plurality of first data registers.

26. The method of claim 25, wherein the latched data is provided by plurality of first registers so that an amount of overlap between the data windows of the at least some respective portions provides an extended window in which a setup-and-hold time for the plurality of second registers can reside to facilitate latching the overlapping respective portions of the data into at least some of the plurality of second data registers.

27. The method of claim 26, further comprising outputting the respective portions of the data from the plurality of second registers as a multiple bit data stream synchronized relative to the system clock.

28. The method of claim 24, wherein the bi-directional data bus comprises a bi-directional double-data rate bus.

* * * * *

UNITED STATES PATENT AND TRADEMARK OFFICE
CERTIFICATE OF CORRECTION

| | | |
|---|---|---|
| PATENT NO. | : 7,233,543 B2 | Page 1 of 1 |
| APPLICATION NO. | : 11/069489 | |
| DATED | : June 19, 2007 | |
| INVENTOR(S) | : Victoria Lo-Ren Smith et al. | |

It is certified that error appears in the above-identified patent and that said Letters Patent is hereby corrected as shown below:

In column 10, line 9, delete "$register_1$" and insert -- $register_i$ --, therefor.

In column 10, line 11, after "the" delete "registers" and insert -- $register_i$ --, therefor.

In column 10, line 11, after "After" delete "$register_1$" and insert -- $register_i$ --, therefor.

In column 10, lines 44, delete "registers" and insert -- $register_i$ --, therefor.

In column 11, line 27, in Claim 4, delete "sonic" and insert -- some --, therefor.

In column 11, line 57, in Claim 10, after "output of" delete "for".

In column 13, line 22, in Claim 24, after "window of" delete "for".

Signed and Sealed this

Nineteenth Day of August, 2008

JON W. DUDAS
*Director of the United States Patent and Trademark Office*